United States Patent
Suenaga et al.

(10) Patent No.: US 8,860,286 B2
(45) Date of Patent: Oct. 14, 2014

(54) PIEZOELECTRIC THIN FILM ELEMENT, AND PIEZOELECTRIC THIN FILM DEVICE

(75) Inventors: Kazufumi Suenaga, Tsuchiura (JP); Kenji Shibata, Tsukuba (JP); Kazutoshi Watanabe, Tsuchiura (JP); Akira Nomoto, Kasumigaura (JP)

(73) Assignee: Hitachi Metals, Ltd., Tokyo (JP)

(*) Notice: Subject to any disclaimer, the term of this patent is extended or adjusted under 35 U.S.C. 154(b) by 261 days.

(21) Appl. No.: 13/577,405

(22) PCT Filed: Feb. 15, 2011

(86) PCT No.: PCT/JP2011/053097
§ 371 (c)(1), (2), (4) Date: Aug. 6, 2012

(87) PCT Pub. No.: WO2011/102329
PCT Pub. Date: Aug. 25, 2011

(65) Prior Publication Data
US 2012/0306314 A1    Dec. 6, 2012

(30) Foreign Application Priority Data

Feb. 16, 2010 (JP) ................. 2010-031289

(51) Int. Cl.
 *H01L 41/187* (2006.01)
 *H01L 41/08* (2006.01)
 *H01L 41/316* (2013.01)

(52) U.S. Cl.
 CPC ........ *H01L 41/0805* (2013.01); *H01L 41/1873* (2013.01); *H01L 41/316* (2013.01)
 USPC .......................................... 310/358; 310/311

(58) Field of Classification Search
 USPC ...... 310/358, 328, 311; 252/62.9 PZ, 62.9 R; 501/134
 See application file for complete search history.

(56) References Cited

U.S. PATENT DOCUMENTS

| | | | | |
|---|---|---|---|---|
| 7,902,730 B2* | 3/2011 | Shibata et al. | | 310/358 |
| 8,310,135 B2* | 11/2012 | Suenaga et al. | | 310/358 |
| 8,310,136 B2* | 11/2012 | Suenaga et al. | | 310/358 |
| 2008/0308762 A1* | 12/2008 | Ueno et al. | | 252/62.9 R |
| 2009/0075066 A1 | 3/2009 | Shibata et al. | | |
| 2009/0302715 A1 | 12/2009 | Shibata et al. | | |

FOREIGN PATENT DOCUMENTS

| JP | 2007-019302 A | 1/2007 |
|---|---|---|
| JP | 2009-094449 A | 4/2009 |
| JP | 2009-295786 A | 12/2009 |
| JP | 2010-016018 A | 1/2010 |

OTHER PUBLICATIONS

International Search Report in PCT/JP2011/053097 dated Feb. 15, 2011 (English Translation Thereof).

* cited by examiner

*Primary Examiner* — Thomas Dougherty
*Assistant Examiner* — Karen B Addison
(74) *Attorney, Agent, or Firm* — McGinn IP Law Group, PLLC

(57) ABSTRACT

Disclosed are a piezoelectric thin film element and a piezoelectric thin film device which have improved piezoelectric properties and high performance and can be produced in improved yields. The piezoelectric thin film element (1) comprises: a substrate (10), and a piezoelectric thin film (40) which is arranged on the substrate (10), has at least one crystal structure represented by general formula $(Na_xK_yLi_z)NbO_3$ ($0 \leq x \leq 1$, $0 \leq y \leq 1$, $0 \leq z \leq 0.2$, $x+y+z=1$) and selected from the group consisting of pseudo-cubic crystal, a hexagonal crystal, and an orthorhombic crystal, and contains an inert gas element at a ratio of 80 ppm or less by mass.

13 Claims, 11 Drawing Sheets

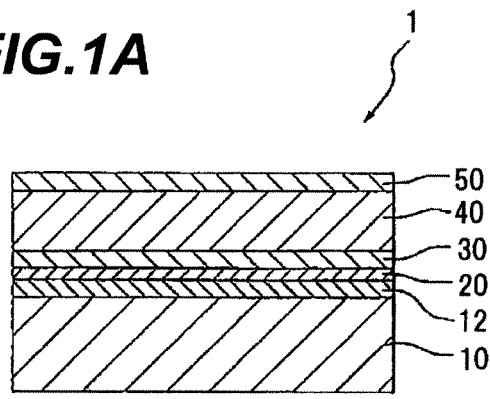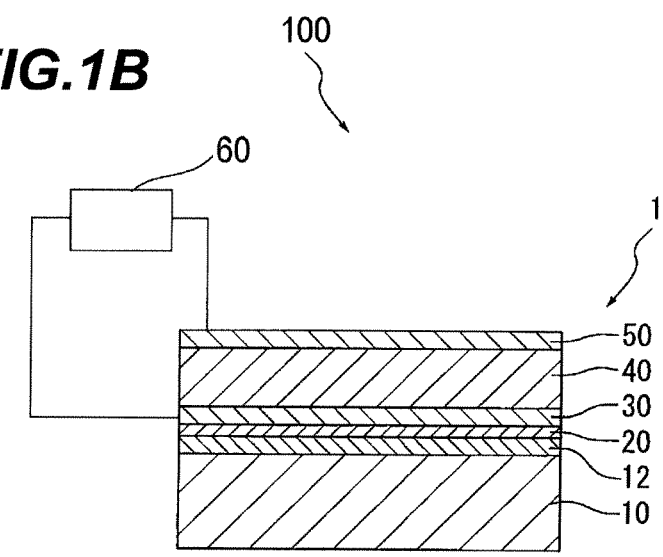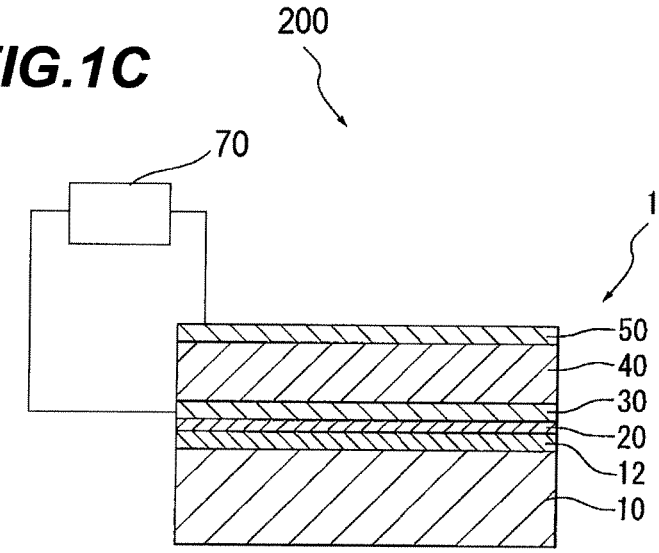

● :Na, K
◉ :Nb
○ :O

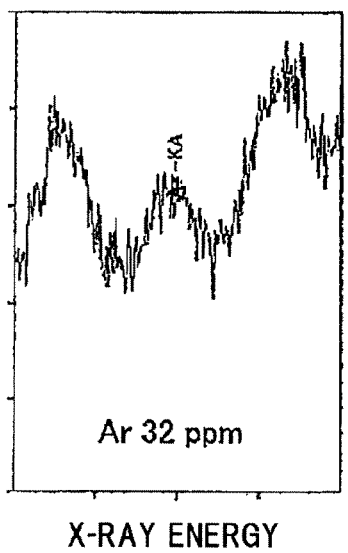
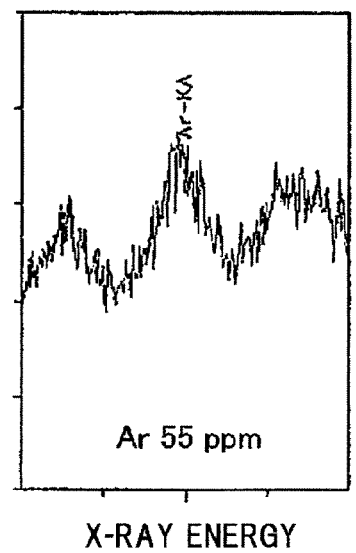
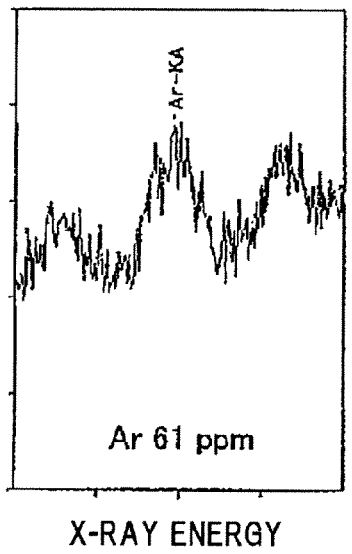
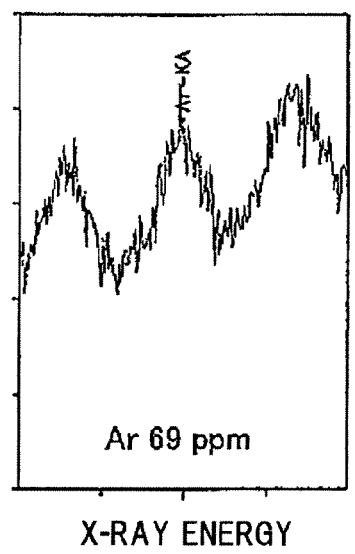

PIEZOELECTRIC THIN FILM ELEMENT, AND PIEZOELECTRIC THIN FILM DEVICE

The present application is based on Japanese patent application No. 2010-031289 filed on Feb. 16, 2010, the entire contents of which are incorporated herein by reference.

BACKGROUND OF THE INVENTION

1. Field of the Invention

The present invention relates to a piezoelectric thin film element and a piezoelectric thin film device. In particular, it relates to a piezoelectric thin film element and a piezoelectric thin film device using a piezoelectric material that contain no lead, such as a lithium potassium sodium niobate, or the like.

2. Description of the Related Art

Piezoelectric substances are processed into various piezoelectric elements according to various purposes, and are utilized widely as functional electronic components, such as an actuator, which applies voltage to cause deformation, a sensor, which conversely uses deformation of the piezoelectric element to generate voltage, or the like.

In recent years, from environmental concerns, the development of piezoelectric substances that contain no lead has been desired. For example, a lithium potassium sodium niobate (general formula: $(Na_xK_yLi_z)NbO_3$ (0<x<1, 0<y<1, 0<z<1, x+y+z=1), etc. has been developed. The lithium potassium sodium niobate possesses as good a piezoelectric property as $Pb(Zr_{1-x}Ti_x)O_3$ based perovskite type ferroelectrics (PZT), and is therefore expected as a major candidate for a lead-free piezoelectric material. The lead-free piezoelectric thin film may be used to produce a head for a high-definition high-speed inkjet printer, a low-cost micro gyrosensor, which are small in environmental load, and the like.

Also, with reduction in size and enhancement in performance of electronic components of each kind, there is a strong demand for size reduction and performance enhancement of piezoelectric elements as well. However, when the thickness of a piezoelectric material produced by a conventional piezoelectric element production method using sintering is particularly below 10 μm that approaches the size of crystal grains constituting the piezoelectric material, the effect thereof becomes non-negligible. This causes noticeable property variation and degradation of the piezoelectric material. In order to avoid the property variation and degradation of the piezoelectric material, piezoelectric thin film production methods have been studied that apply thin film technology, etc. replaced for the sintering method.

As a conventional lead-free piezoelectric thin film element, a piezoelectric thin film element using a dielectric film formed of an alkali niobium oxide based perovskite compound is known (refer to Patent Document 1). The piezoelectric thin film element disclosed by Patent Document 1 comprises a substrate formed of MgO, etc., a lower electrode formed on the substrate, a buffer layer formed of $BaTiO_3$, etc., and formed on the lower electrode, an alkali niobium oxide based perovskite compound represented by the general formula $(Na_xK_yLi_z)NbO_3$ (0<x<1, 0<y<1, x+y+z=1), a piezoelectric thin film formed on the buffer layer, and an upper electrode formed on the piezoelectric thin film, in which the piezoelectric thin film is formed by RF magnetron sputtering, CVD, PLD, coating, or the like.

Since the piezoelectric thin film element disclosed by Patent Document 1 has the structure as described above, it has a good piezoelectric property.

Patent Document: JP-A-2007-19302.

SUMMARY OF THE INVENTION

However, the piezoelectric thin film element obtained in the prior art (e.g. Patent Document 1) has difficulty achieving a desired piezoelectric constant, and also has a problem with lifetime of the element, even when a desired piezoelectric constant is achieved. Also, it has difficulty achieving a good yield of the piezoelectric thin film element having a great piezoelectric constant.

Accordingly, it is an object of the present invention to provide a piezoelectric thin film element and a piezoelectric thin film device, which allow its enhanced piezoelectric property, enhanced performance, and enhanced productive yield to be ensured.

(1) So as to achieve the above object, the invention provides a piezoelectric thin film element comprising:
 a substrate; and
 a piezoelectric thin film provided on the substrate,
 wherein the piezoelectric thin film has at least one crystal structure represented by the general formula $(Na_xK_yLi_z)NbO_3$ (0≤x≤1, 0≤y≤1, 0≤z≤0.2, x+y+z=1), and selected from the group consisting of a pseudocubic crystal, a tetragonal crystal, and orthorhombic crystal, and contains a mass ratio of an inert gas element of not more than 80 ppm.

(2) The piezoelectric thin film may contain a not less than 30 ppm and not more than 70 ppm of the inert gas element.

(3) The piezoelectric thin film may contain a not more than 0.16 μg/cm² of the inert gas element.

(4) The piezoelectric thin film may contain a not less than 0.06 μg/cm² and not more than 0.15 μg/cm² of the inert gas element.

(5) The inert gas element may be argon (Ar).

(6) The piezoelectric thin film element further may comprise a lower electrode between the substrate and the piezoelectric thin film.

(7) The piezoelectric thin film may include strain parallel to a surface of the substrate.

(8) The strain may be strain due to tensile or compressive stress.

(9) The piezoelectric thin film may include inhomogeneous strain in a perpendicular or parallel direction, or perpendicular and parallel directions, to a surface of the substrate.

(10) The lower electrode may include an electrode layer formed of Pt or a Pt containing alloy.

(11) The lower electrode may include a single crystalline oriented layer oriented preferentially in a perpendicular direction to a surface of the substrate.

(12) So as to achieve the above object, the invention provides a piezoelectric thin film device comprising:
 the piezoelectric thin film element according to (1); and
 a voltage applying portion which applies voltage to the piezoelectric thin film element.

(13) So as to achieve the above object, the invention provides a piezoelectric thin film device comprising:
 the piezoelectric thin film element according to the embodiment (1); and
 a voltage detecting portion which detects voltage applied to the piezoelectric thin film element.

Effects of the Invention

According to the present invention, it is possible to provide a piezoelectric thin film element and a piezoelectric thin film device, which allow its enhanced piezoelectric property, enhanced performance, and enhanced productive yield to be ensured.

Points of the Invention

According to one embodiment of the invention, a piezoelectric thin film element is constructed such that inert gas element content in a piezoelectric thin film is controlled precisely to be within a specified range, thereby allowing the crystalline orientation of a piezoelectric thin film to be stably controlled to be a specified orientation. This allows the realization of the high quality piezoelectric thin film element, and the enhancement of the piezoelectric property of piezoelectric thin film device having the piezoelectric thin film element, therefore making it possible to provide high performance micro device at low cost and with a good yield.

BRIEF DESCRIPTION OF THE DRAWINGS

The preferred embodiments according to the invention will be explained below referring to the drawings, wherein:

FIG. 1A is a longitudinal cross-sectional view showing a piezoelectric thin film element in an embodiment according to the invention;

FIG. 1B is a schematic diagram showing a piezoelectric actuator using the piezoelectric thin film element in the embodiment according to the invention;

FIG. 1C is a schematic diagram showing a piezoelectric sensor using the piezoelectric thin film element in the embodiment according to the invention;

FIG. 5A is a diagram showing a fluorescent X-ray spectrum in the vicinity of Ar-Kα of the piezoelectric thin film when the Ar content is 32 ppm in the piezoelectric thin film element in Example 2;

FIG. 5B is a diagram showing a fluorescent X-ray spectrum in the vicinity of Ar-Kα of the piezoelectric thin film when the Ar content is 55 ppm in the piezoelectric thin film element in Example 2;

FIG. 5C is a diagram showing a fluorescent X-ray spectrum in the vicinity of Ar-Kα of the piezoelectric thin film when the Ar content is 61 ppm in the piezoelectric thin film element in Example 2;

FIG. 5D is a diagram showing a fluorescent X-ray spectrum in the vicinity of Ar-Kα of the piezoelectric thin film when the Ar content is 69 ppm in the piezoelectric thin film element in Example 2;

Figure 2:
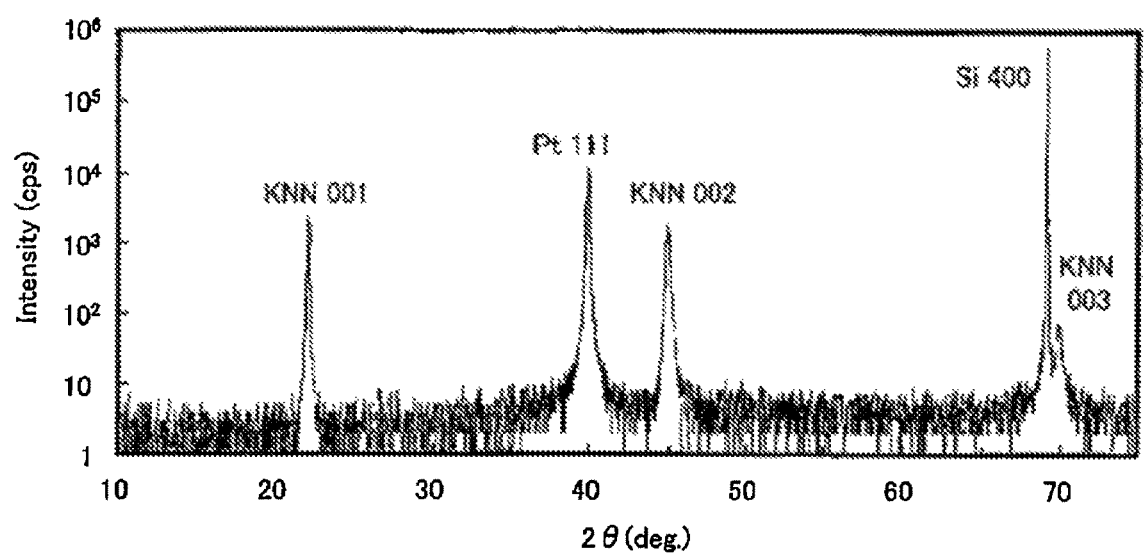
FIG. 2 is a diagram showing an X-ray diffraction pattern (2θ/θ scan) of a piezoelectric thin film element in Example 1.

DETAILED DESCRIPTION OF THE PREFERRED EMBODIMENTS (Summary of the Embodiment)

A piezoelectric thin film element is provided that comprises a substrate, and a piezoelectric thin film provided on the substrate, wherein the piezoelectric thin film has at least one crystal structure represented by the general formula $(Na_xK_yLi_z)NbO_3$ ($0 \le x \le 1$, $0 \le y \le 1$, $0 \le z \le 0.2$, $x+y+z=1$), and selected from the group consisting of a pseudocubic crystal, a tetragonal crystal, and an orthorhombic crystal, and contains a mass ratio of an inert gas element of not more than 80 ppm. Here, "not more than 80 ppm" excludes "0". Namely, the mass ratio of the inert gas exceeds 0 and is not more than 80 ppm.

(Inventor's Findings)

A piezoelectric thin film element 1 in this embodiment is based on the following inventor's findings. That is, in the past, no analytic detail and film formation control based on analysis results of the Ar (operating gas used in a sputtering apparatus) content contained in a lithium potassium sodium niobate film (including a potassium sodium niobate film) have been provided. That is, in the past, the relationship between the recoil Ar or Ar ions implanted into the piezoelectric thin film during sputtering in film formation, the input power during film formation, the film formation temperature, and the varying distance between a substrate and a target raw material, the inert gas element content in the piezoelectric thin film, etc. have been unclear.

However, the present inventors have found that the inert gas element content contained in the piezoelectric thin film is one factor in determining the property of the piezoelectric thin film. That is, the present inventors have found that, in the past, no piezoelectric thin film having a desired high piezoelectric constant has reproducibly been obtained because the inert gas element content in the piezoelectric thin film, which is one factor in determining the property of the piezoelectric thin film, has not precisely been quantified, but the piezoelectric thin film production has been based on qualitative evaluation results. That is, when the piezoelectric thin film has been formed by sputtering which is a fruitful method for mass production, the inert gas used for the sputtering apparatus has mixed into the piezoelectric thin film during film formation of the piezoelectric thin film. It has then been found that because of no quantitative management of the relationship between the inert gas element content contained in the piezoelectric thin film and the piezoelectric property of the piezoelectric thin film, it may have been difficult to produce a long lifetime and great piezoelectric constant piezoelectric thin film element with a good yield.

Also, the stress (strain) produced inside the piezoelectric thin film is correlated with its piezoelectric constant, so that the other element excluding the elements constituting the piezoelectric thin film, i.e. the inert gas element used for the sputtering apparatus mixed into the piezoelectric thin film causes variation in the piezoelectric constant. It has therefore been found that when the piezoelectric thin film has been formed by sputtering, the inert gas element exceeding a specified amount mixed into the piezoelectric thin film may have caused internal stress in the piezoelectric thin film, leading to deterioration in the piezoelectric property of that piezoelectric thin film, and also a decrease in its productive yield.

In practice, a plurality of lithium potassium sodium niobate films whose Ar element contents are different have different piezoelectric properties, respectively, for each production lot. The present inventors have found that the reason for that is because variations in the Ar element content in the piezoelectric thin films have not been grasped, i.e. controlled precisely to form the piezoelectric thin films.

For example, during sputtering in film formation, increasing input power causes recoil Ar or Ar ions, which are high energy particles, together with sputter particles (i.e. particles of materials constituting the piezoelectric thin film), to be taken into the piezoelectric thin film. This results in the piezoelectric thin film comprising polycrystalline grains containing the Ar elements. In this case, qualitative analysis results of the bases of the piezoelectric thin film may promptly be obtained with an analysis means, such as an electron probe micro analyzer (EPMA) or the like, but the lower limit at which the bases of the piezoelectric thin film are detected with such an analysis means is low.

Therefore, a tiny amount of Ar contained in the piezoelectric thin film cannot accurately be evaluated. Consequently, in the past, the effect of the tiny amount of inert gas contained in the piezoelectric thin film by sputtering in film formation on the property of that piezoelectric thin film has been unknown. That is, the present inventors have considered that unless the inert gas element content in the piezoelectric thin film is controlled precisely, the deterioration in the property of the piezoelectric thin film caused by the inert gas element mixing into the piezoelectric thin film cannot be grasped, therefore rendering it impossible to achieve a further enhanced piezoelectric constant of the piezoelectric thin film, and stable production of the piezoelectric thin film.

Thus, to precisely manage and control the Ar gas content in a lithium potassium sodium niobate film, the present inventors have studied the sputtering film production conditions for enhancing the piezoelectric property of the piezoelectric thin film, with respect to film formation temperature of the piezoelectric thin film of lithium potassium sodium niobate, kind of the inert gas used for sputtering, pressure of the inert gas, degree of vacuum during film formation, input power during film formation, and heat treatment after film formation. The piezoelectric thin film element 1 in this embodiment has then been achieved by ensuring the optimization of the piezoelectric thin film production conditions.

The present inventors have specifically and precisely studied the conditions such as film formation temperature, for each sputtering apparatus, and in various film formation condition environments, and have found that a lithium potassium sodium niobate film containing an appropriate amount of inert gas element can reproducibly be formed.

In practice, to control the inert gas element Ar content in a polycrystalline or epitaxially grown monocrystalline lithium potassium sodium niobate film, the sputtering input power or power density for example is controlled so that the Ar content per unit area or unit volume of the piezoelectric thin film is within a constant range. Specifically, the film formation conditions are precisely set so that the input power or power density is constant. Also, after piezoelectric thin film formation, the piezoelectric thin film is heated using thermal radiation of an infrared lamp and thermal conduction of a heater to thereby set the heat treatment temperature to optimize the range of the Ar content contained in the piezoelectric thin film.

Further, the pressure and flow of the inert gas introduced into the sputtering film formation apparatus are determined to be optimum to meet each of the above conditions. Also, the present inventors have found that selecting another inert gas excluding Ar or the Ar containing inert gas and precisely controlling the inert gas element content in the piezoelectric thin film allows stable reproduction of the lithium potassium sodium niobate film exhibiting a high piezoelectric constant to be expected. Also, the present inventors have found that adjusting the recoil Ar amount according to density and constituent elements of the sputtering target material, or increasing/decreasing of kinetic energy of fast neutral particles of another inert gas excluding Ar allows the optimization of the operating gas element content taken into the piezoelectric thin film.

(Embodiment)
(Structure of Piezoelectric Thin Film Element 1)

FIG. 1A is a schematic longitudinal cross-sectional view showing a piezoelectric thin film element in an embodiment according to the invention.

The piezoelectric thin film element 1 in this embodiment comprises: a substrate 10 including an oxide film 12 over one surface; a lower electrode 30 provided over the substrate 10 (i.e. the oxide film 12 surface) via an adhesive layer 20, a piezoelectric thin film 40 provided over the lower electrode 30, and formed mainly of a perovskite material, and an upper electrode 50 provided over the piezoelectric thin film 40. Also, the piezoelectric thin film 40 is formed of a material represented by the general formula $(Na_xK_yLi_z)NbO_3$ (where $0 \le x \le 1$, $0 \le y \le 1$, $0 \le z \le 0.2$, $x+y+z=1$). Further, the constituent material of the lower electrode 30 is oriented in a specified direction relative to the substrate 10 surface, while the constituent material of the piezoelectric thin film 40 is oriented preferentially in a specified direction relative to the lower electrode 30.

Here, the piezoelectric thin film 40 is formed to have at least one crystal structure selected from the group consisting of a pseudocubic crystal, a tetragonal crystal, and an orthorhombic crystal. The piezoelectric thin film 40 is formed to have any one crystal structure of the pseudocubic crystal, the tetragonal crystal, and the orthorhombic crystal, or to have a mixture of two or more of these crystal structures.

Also, the piezoelectric thin film 40 is formed to contain a not more than 80 ppm, preferably not less than 30 ppm and not more than 70 ppm of inert gas element in mass ratio (i.e. content ratio of the inert gas element to the constituent elements of the piezoelectric thin film 40). Here, "not more than 80 ppm" excludes "0". Namely, the mass ratio of the inert gas exceeds 0 and is not more than 80 ppm. Also, the piezoelectric thin film 40 is formed to contain a not more than 0.16 μg/cm², preferably not less than 0.06 μg/cm² and not more than 0.15 μg/cm² of inert gas element.

The substrate 10 may use a Si substrate, MgO substrate, Zn substrate, $SrTiO_3$ substrate, $SrRuO_3$ substrate, glass substrate, quartz glass substrate, GaAs substrate, GaN substrate, sapphire substrate, Ge substrate, stainless steel substrate, or the like. In this embodiment, it is preferred to use a Si substrate, which is low cost, and fruitful for industrial use.

The oxide film 12 may, when the substrate 10 is formed of Si, use a thermal oxide film formed on the substrate 10 surface by thermal oxidation. Also, the oxide film 12 may be formed by use of chemical vapor deposition to form the Si oxide film on the substrate 10 surface. When the substrate 10 is formed of another material excluding Si, the lower electrode 30 formed of Pt or the like may be formed directly on the oxide substrate, such as a quartz glass substrate, MgO substrate, SrTiO$_3$ substrate, SrRuO$_3$ substrate or the like, without the oxide film 12 being provided on the substrate 10 surface.

The lower electrode 30 may be formed of Pt or a Pt containing alloy. Also, the lower electrode 30 may be formed to have a stacked structure including an electrode layer formed of Pt or a Pt containing alloy, and an electrode layer formed of a conductive material. Further, the lower electrode 30 may be formed to have a metal layer including at least one element selected from the group consisting of Ru, Ir, Sn, and In, an oxide layer including an oxide of at least one element selected from the group consisting of Ru, Ir, Sn, and In, or a compound layer including a compound of at least one element selected from the group consisting of Ru, Ir, Sn, and In and an constituent element of the piezoelectric thin film 40. Also, the lower electrode 30 may be formed of a stacked structure including an electrode layer formed of Pt or a Pt containing alloy and/or at least one selected from the group consisting of an electrode layer formed of a conductive material, a metal layer, an oxide layer, and a compound layer.

Also, the lower electrode 30 may be formed to have a single crystalline oriented layer oriented preferentially in a perpendicular direction to the substrate 10 (e.g. Si substrate) surface. For example, the lower electrode 30 may be formed to have a single Pt layer formed to be oriented to a (111) plane.

Further, the adhesive layer 20 may be provided between the substrate 10 and the lower electrode 30 to enhance the adhesion therebetween. The adhesive layer 20 may be formed of a thin film formed of a metal material such as Ti or the like.

The piezoelectric thin film 40 is formed mainly of a perovskite oxide represented by $(Na_xK_yLi_z)NbO_3$ (where $0 \le x \le 1$, $0 \le y \le 1$, $0 \le z \le 0.2$, $x+y+z=1$), as described above. The potassium sodium niobate, or lithium potassium sodium niobate constituting the piezoelectric thin film 40 may be doped with specified amounts of Cu, Ta, V and/or the like.

Also, the piezoelectric thin film 40 is formed to include at least one of an ABO$_3$ crystal or amorphous ABO$_3$ (where A is one element selected from the group consisting of Li, Na, K, La, Sr, Nd, Ba, and Bi, and B is one element selected from the group consisting of Zr, Ti, Mn, Mg, Nb, Sn, Ta, and In, and O is oxygen). That is, the piezoelectric thin film 40 may be formed to include either or both of an ABO$_3$ crystal or amorphous ABO$_3$.

Also, the piezoelectric thin film 40 may have strain in a parallel direction to the substrate 10 surface. This strain is strain caused by tensile or compressive stress. The piezoelectric thin film 40 may have no strain (i.e. no internal stress caused). Further, the piezoelectric thin film 40 may have inhomogeneous strain in a perpendicular or parallel direction, or perpendicular and parallel directions, to the substrate 10 surface.

The strain of the piezoelectric thin film 40 occurs in response to a variation in the inert gas element content contained in the piezoelectric thin film 40. For example, compressive or tensile stress occurs in the piezoelectric thin film 40 in response to a variation in the inert gas element content in the piezoelectric thin film 40. Also, the piezoelectric thin film 40 may be formed by controlling the inert gas element content in the piezoelectric thin film 40, to have no stress, i.e. no strain caused in the piezoelectric thin film 40.

The upper electrode 50 may be formed of Pt or a Pt containing alloy. Also, the upper electrode 50 may be formed to have a stacked structure including an electrode layer formed of Pt or a Pt containing alloy, and an electrode layer formed of a conductive material. Further, the upper electrode 50 may be formed to have a metal layer including at least one element selected from the group consisting of Ru, Ir, Sn, and In, an oxide layer including an oxide of at least one element selected from the group consisting of Ru, Ir, Sn, and In, or a compound layer including a compound of at least one element selected from the group consisting of Ru, Ir, Sn, and In and an constituent element of the piezoelectric thin film 40.

The piezoelectric thin film element 1 thus structured has high piezoelectric constant. Also, a piezoelectric thin film device may be realized by molding the piezoelectric thin film element 1 into a specified shape, and providing the piezoelectric thin film element 1 with a voltage applying portion which applies voltage to the piezoelectric thin film element 1. Further, the piezoelectric thin film device may be realized by molding the piezoelectric thin film element 1 into a specified shape, and providing the piezoelectric thin film element 1 with a voltage detecting portion which detects voltage applied to the piezoelectric thin film element 1. The piezoelectric thin film device is, for example, an actuator, a sensor, or the like.

FIG. 1B is a schematic diagram showing a piezoelectric actuator 100 using the piezoelectric thin film element 1 in the embodiment according to the invention. As shown in FIG. 1B, the piezoelectric actuator 100 comprises the piezoelectric thin film element 1 and a power source 60 as a voltage applying portion for applying a voltage to the piezoelectric thin film element 1. Although FIG. 1B shows a unimorph type piezoelectric actuator, it is also possible to provide a bimorph type piezoelectric actuator in which piezoelectric thin films 40 are provided on both sides of the substrate 10 respectively, and a laminate type piezoelectric actuator in which a plurality of piezoelectric thin films 40 are laminated.

FIG. 1C is a schematic diagram showing a piezoelectric sensor using the piezoelectric thin film element in the embodiment according to the invention. As shown in FIG. 1C, the piezoelectric sensor 200 comprises the piezoelectric thin film element 1 and a voltmeter 70 as a voltage detecting portion for detecting a voltage applied to the piezoelectric thin film element 1. Although FIG. 1C shows a unimorph type piezoelectric sensor, it is also possible to provide a bimorph type piezoelectric sensor in which piezoelectric thin films 40 are provided on both sides of the substrate 10 respectively, and a laminate type piezoelectric sensor in which a plurality of piezoelectric thin films 40 are laminated.

(Production of Piezoelectric Thin Film 40)

The piezoelectric thin film 40 may be formed by use of RF sputtering, ion beam sputter, CVD or the like. The inert gas (e.g. Ar) content in the piezoelectric thin film 40 may be controlled by adjusting each parameter below.

The first parameter is power input to a sputtering apparatus (i.e. magnitude of input power and/or magnitude of input power density). The sputtering apparatus may use an RF sputtering apparatus. For example, the RF sputtering apparatus includes a film formation chamber, a piezoelectric target material (e.g. KNN target) placed inside the film formation chamber, and a stage for mounting and holding a specified substrate for forming the piezoelectric thin film 40 and provided at a position opposite the target. When the KNN thin film is then formed on the specified substrate, the inert gas is introduced into the film formation chamber, and ionized by high frequency electric field application. The ionized inert gas then collides with the target, to separate the constituent material of the target into particles, to stack the particles on the substrate provided at the position opposite the target, to produce the piezoelectric thin film on the substrate. Here, the density of power input to the sputter (sputter input power density "p") is sputter power per unit area of the target. Let "P" and "S" be the sputter input power and the area of the target, respectively, then p=P/S. The unit of the sputter input power is "watt (W)."

The second parameter is heat treatment or not of the piezoelectric thin film 40 after film formation, and heat treatment temperature when the heat treatment is done.

The third parameter is pressure of the inert gas introduced into the sputtering apparatus. The pressure of the inert gas (e.g. Ar) is controlled to range, for example, from not less than 0.3 Pa to not more than 1.4 Pa so that the Ar amount contained in the piezoelectric thin film 40 is a specified content. The pressure of the Ar gas is adjusted by controlling the flow of the Ar gas introduced into the film formation chamber of the sputtering apparatus, and/or the opening or closing of a vent valve.

The fourth parameter is the distance between the target and the substrate 10 (herein referred to as "the TS distance"). For example, the TS distance is set to be within a range of not more than 150 mm.

(Advantages of the Embodiment)

In the piezoelectric thin film element 1 in this embodiment, the inert gas element content in the piezoelectric thin film 40 is controlled precisely to be within the specified range, thereby allowing the crystalline orientation of the piezoelectric thin film 40 to be stably controlled to be a specified orientation. This allows the realization of the high quality piezoelectric thin film element 1, and the enhancement of the piezoelectric property of piezoelectric thin film device having the piezoelectric thin film element 1, therefore making it possible to provide high performance micro device at low cost and with a good yield.

That is, in the piezoelectric thin film element 1 in this embodiment, the substrate 10, the adhesive layer 20, the lower electrode 30, the piezoelectric thin film 40, and the upper electrode 50, which constitute the piezoelectric thin film element 1, are configured as described in the embodiment, and the film formation conditions of the piezoelectric thin film 40 are ensured to be optimized, thereby allowing the precise control of the amount of the inert gas element taken into the piezoelectric thin film 40 introduced into the sputtering apparatus used for piezoelectric thin film 40 formation. This allows the enhancement of the piezoelectric property of the piezoelectric thin film element 1. Also, the control of the crystalline orientation of the piezoelectric thin film 40 formed of the lithium potassium sodium niobate or the like allows the further enhancement of the piezoelectric property to be ensured.

Also, the inert gas such as Ar gas exists as a single atom in the piezoelectric thin film, without forming a solid solution between it and the piezoelectric thin KNN film. Therefore, the piezoelectric thin film composition itself before inert gas mixing is substantially not altered in its properties, but the inert gas atoms having an atomic radius different from the radii of constituent elements of the piezoelectric thin film move into between crystal lattices of the constituent material of the piezoelectric thin film, or the constituent elements of the piezoelectric thin film are substituted with the inert gas atoms. This allows the local or entire occurrence of strain (or internal stress). In general, a method utilizing the chemical pressure effect to alter physical properties of ionic crystalline substances is known. That is, in this embodiment, the inert gas atoms are deliberately contained in the piezoelectric thin film, thereby inhibiting the degeneration of the piezoelectric thin film body caused by "chemical reactions," and controlling only strain or internal stress caused by the "chemical pressure effect," and therefore allowing enhancement of the piezoelectric property of the piezoelectric thin film.

The use of a Si substrate, a glass substrate or the like as the substrate 10 allows the piezoelectric thin film 40 with the controlled inert gas element content to be easily formed on the substrate 10. It is therefore possible to provide the piezoelectric thin film element 1 at low cost. Also, the piezoelectric thin film element 1 in this embodiment uses no lead. Accordingly, the use of the piezoelectric thin film element 1 in this embodiment allows a reduction in environmental load, and the realization of a high performance piezoelectric device. As the piezoelectric device, there are micro systems (e.g. micro electro mechanical systems (MEMS)), such as a micro motor, a micro sensor, and a micro actuator, and a filter, such as a surface acoustic wave device with a substrate, a piezoelectric layer formed on the substrate, and an electrode formed on the piezoelectric layer, for example.

Example 1

In Example 1, a piezoelectric thin film element 1 is fabricated which is provided with a Si substrate as the substrate 10 having an oxide film 12, an adhesive layer 20 provided over the oxide film 12, a lower electrode 30 provided over the adhesive layer 20, a piezoelectric thin film 40 formed of a perovskite potassium sodium niobate (herein referred to as KNN) provided over the lower electrode 30, and an upper electrode 50 provided over the piezoelectric thin film 40 surface.

Specifically, the piezoelectric thin film element 1 in Example 1 is fabricated as follows. First prepared is the circular (4 inch diameter) Si substrate as the substrate 10. The Si substrate surface is then thermally oxidized, to thereby form the 150 nm thick thermal oxide film over the Si substrate surface as the oxide film 12. The lower electrode 30 formed of a 100 nm thick Pt thin film is then formed over the thermal oxide film 12 via the 2 nm thick Ti adhesive layer 20. The lower electrode 30 may be formed of a 100 nm thick Au thin film, a stacked layer of a Pt thin film and a Au thin film, or an alloy thin film of Pt and Au.

Here, the lower electrode 30 formation uses sputtering. The sputtering target uses a metal target, and the sputtering input power during film formation is set at 100 W. Also, the sputtering gas (i.e. gas introduced into the film formation chamber) uses a 100% purity Ar gas (where the Ar gas pressure is set at 2.5 Pa). The sputtering gas may use a mixture of Ar gas and $O_2$ gas, or a mixture of gases including at least one inert gas selected from the group consisting of He, Ne, Kr, and $N_2$. Further, the temperature of the Si substrate is heated at 350° C. during film formation. This results in the lower electrode 30 formed of polycrystalline Pt.

The potassium sodium niobate (KNN) thin film is then formed over the lower electrode 30 as the piezoelectric thin film 40. The KNN thin film 40 formation uses RF sputtering. The film formation conditions are adjusted to contain an Ar element in the KNN thin film 40. The input power during the KNN film formation is set at 75 W, and the Ar gas pressure is set at 1.33 Pa. The 5 μm thick KNN thin film 40 is then formed at a film formation temperature ranging from 400° C. to 500° C. Here, the gas atmosphere within the film formation chamber of the sputtering apparatus uses a mixture of Ar gas and $O_2$ gas (where Ar:$O_2$=5:5). The KNN film 40 is formed using that mixture gas plasma. Also, the sputtering target uses a ceramic target formed of $(Na_xK_yLi_z)NbO_3$ (where x=0.5, y=0.5, z=0). Also, the TS distance is set at 56 mm.

The gas atmosphere within the film formation chamber during the KNN thin film formation may use a mixture of gases including at least one inert gas selected from the group consisting of Ar, He, Ne, Kr, and $N_2$. Also, the KNN thin film thickness is preferably not less than 1 μm and not more than 5 μm.

The KNN thin film formation is followed by heating the KNN thin film in the atmosphere or an oxygen atmosphere. The heating is performed in an Ar inert gas atmosphere at 700° C. The heating temperature in the heating may range from 700° C. to 800° C., and the heating time is set at 2 hours. The heating may be performed in an oxygen atmosphere, an oxygen and inert gas mixture atmosphere, the atmosphere, or a specified pressure vacuum. Also, for the heating in a vacuum, the degree of vacuum is preferably not more than 1.33 Pa.

In this manner, the piezoelectric thin film element 1 in Example 1 is fabricated. Scanning electron microscope observation of a cross section of the KNN thin film of the piezoelectric thin film element 1 produced in Example 1 shows a columnar structure of the KNN thin film composition. Also, the piezoelectric thin film element 1 in Example 1 is analyzed with X-ray diffraction.

Figure 3:
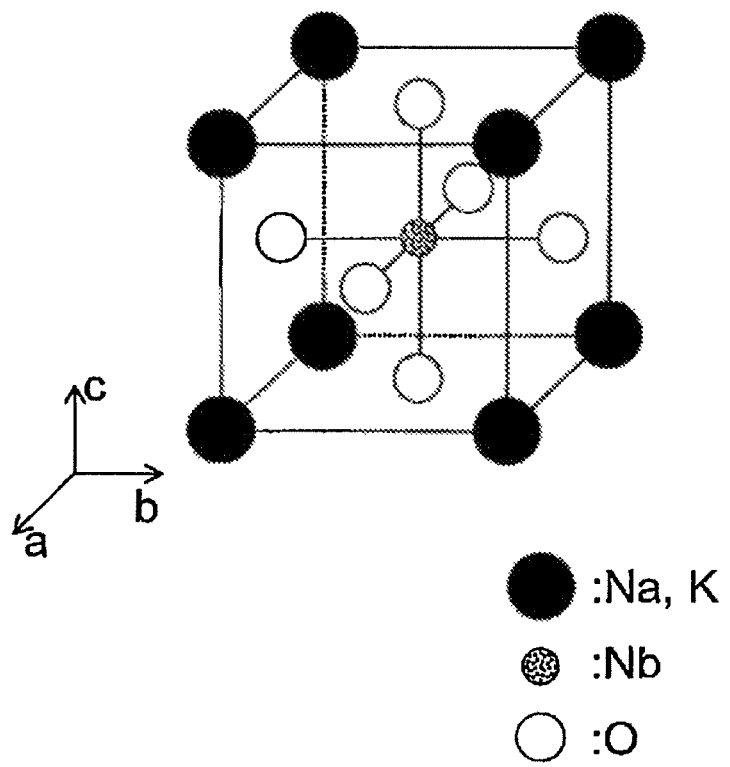
FIG. 3 is a diagram showing a crystal structure of a KNN thin film of the piezoelectric thin film element in Example 1.

FIG. 2 shows an X-ray diffraction pattern (2θ/θ scan) of the piezoelectric thin film element 1 in Example 1. Also, FIG. 3 is a schematic diagram showing a crystal structure of the KNN thin film of the piezoelectric thin film element 1 in Example 1. The X-ray diffraction pattern (of FIG. 2) measuring apparatus, and measuring conditions are as follows. The apparatus uses X' Pert PRO MRD available from PANalytical B.V. Also, the measuring conditions use a Cu Line Focus, 45 kV, 40 mA for an X-ray source, and a hybrid monochrometer for an incident optical system, but no collimator used for an X-ray receiving optical system.

Referring to FIG. 2, it is shown that in the piezoelectric thin film element 1 in Example 1, the Pt thin film (i.e. lower electrode 30) is oriented in a perpendicular direction to the Si substrate 10 surface. That is, it is shown that the Pt thin film is oriented to the (111) plane. Also, the KNN diffraction peaks are observed only at the (001), (002), and (003) respectively. It is therefore shown that the KNN thin film is oriented preferentially to the (001) plane. That is, it is clear that the KNN thin film formed over the Pt film oriented preferentially to the (111) is a polycrystalline thin film having a pseudocubic perovskite crystal structure, as shown in FIG. 3.

Also, the Ar content in the Ar containing KNN thin film is quantitatively evaluated. Specifically, the Ar content in the KNN thin film is analyzed with a fluorescent X-ray analyzer. The result of fluorescent X-ray analysis of the KNN thin film in Example 1 shows that the Ar content in the KNN thin film is 61 ppm (0.122 μg/cm$^2$). The fluorescent X-ray analysis is a method for analyzing elemental species and the elemental species content by irradiating a substance with an X-ray and measuring excited fluorescent X-ray wavelength (or energy) and intensity (see, for example, Yoichi Goshi, Kimitaka Sato ed., "Energy Dispersive X-ray Analysis" Gakkai Shuppan Center, 1989, Izumi Nakai ed., "Fluorescent X-ray Analysis Practice" Asakura Publishing Co., Ltd., 2005).

Example 2

For a piezoelectric thin film element in Example 2, the power input to the sputtering apparatus (i.e. input power), and the Ar content contained in the piezoelectric thin film are varied, to form the KNN thin film. The piezoelectric thin film formation is then followed by heating the piezoelectric thin film in the atmosphere at a specified temperature. Except these points, the piezoelectric thin film element in Example 2 is fabricated in the same manner as the piezoelectric thin film element in Example 1.

Figure 4:
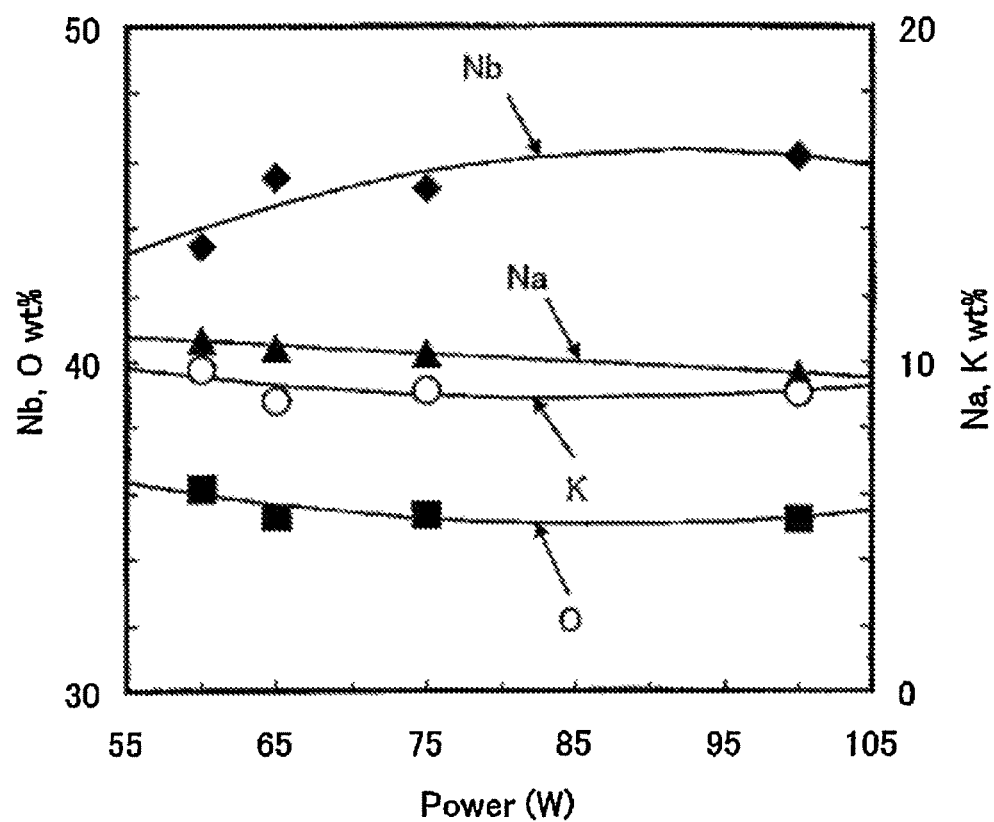
FIG. 4 is a diagram showing the relationship between the power input to a sputtering apparatus and the amount of each composition element constituting a piezoelectric thin film included in a piezoelectric thin film element in Example 2.

FIG. 4 shows the relationship between the power input to a sputtering apparatus and the amount of each composition element constituting a piezoelectric thin film included in a piezoelectric thin film element in Example 2.

Specifically, FIG. 4 shows the composition ratio in weight percent of the constituent elements Nb, K, Na, and O of the potassium sodium niobate (KNN) piezoelectric thin film of the piezoelectric thin film element in Example 2, to the input power for film formation with the sputtering apparatus, when the input power is varied in a range of from 60 W to 100 W. Referring to FIG. 4, no significant variation in the KNN thin film composition is observed, with the variation of the input power. That is, it is shown that in the piezoelectric thin film formation in Example 2, there is no significant variation in the constituent elements of the KNN piezoelectric thin film due to the increase/decrease of the input power.

FIGS. 5A-5D show a fluorescent X-ray spectrum in the vicinity of Ar-Kα of the piezoelectric thin film when the Ar content is varied in the piezoelectric thin film element in Example 2.

Specifically, FIGS. 5A-5D show a fluorescent X-ray spectrum in which they focus on a characteristic X-ray that is a fluorescent X-ray of Ar (i.e. an Ar-Kα ray indicated by KA in FIG. 5). The fluorescent X-ray of Ar contained in the KNN thin film can be identified in all of FIGS. 5A-5D. It is shown that the peak intensity of the characteristic X-ray of Ar is increased with the Ar content concentration (whose unit is ppm) contained in the KNN thin film. That is, the constituent elements of the KNN thin film, and the impurity element excluding the constituent elements of the KNN thin film can be quantified by the precision measurement of the spectrum intensity of that characteristic X-ray, and by use of an analysis method such as a calibration curve method or a fundamental parameter (FP) method (for details of quantitative analysis, see, for example, Yoichi Goshi, Kimitaka Sato ed., "Energy Dispersive X-ray Analysis" Gakkai Shuppan Center, 1989, Izumi Nakai ed., "Fluorescent X-ray Analysis Practice" Asakura Publishing Co., Ltd., 2005).

The measuring apparatus used for quantitative analysis is a fluorescent X-ray analyzer (System3272) available from Rigaku Corporation. A tube of the X-ray source uses Rh, and measurement is made at an output of 4 kW. Also, a mask having a 15 mm diameter opening is placed in an upper surface of the resultant piezoelectric thin film element, and the inner side of this opening is the X-ray irradiation area. In Example 2, the quantitative analysis is made by the use of the FP method.

Figure 6A:
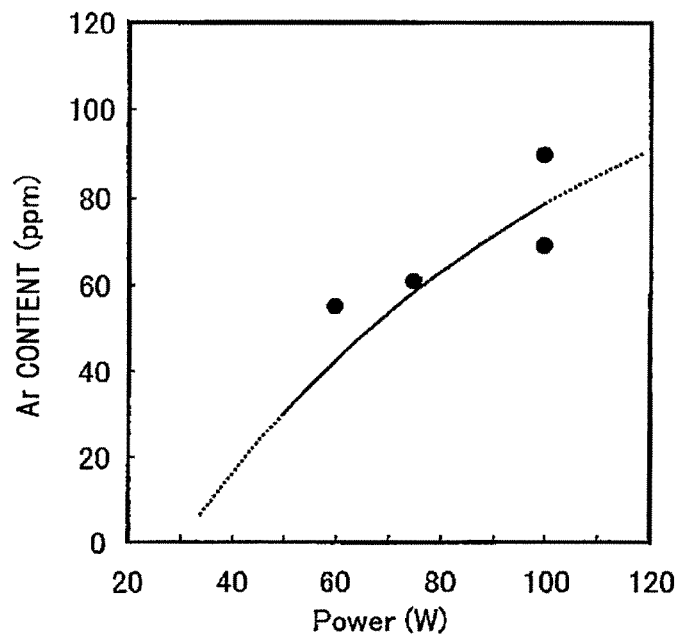
FIG. 6A is a diagram showing the correlation between the power input to the sputtering apparatus and the mass ratio (concentration) of Ar contained in the piezoelectric thin film of the piezoelectric thin film element in Example 2.
Figure 6B:
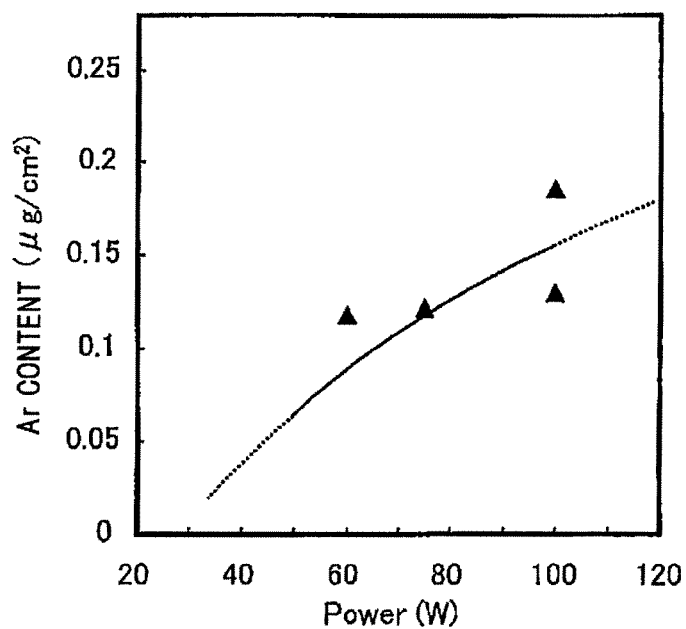
FIG. 6B is a diagram showing the correlation between the power input to the sputtering apparatus and the Ar amount (mass) per unit area of the piezoelectric thin film of the piezoelectric thin film element in Example 2.

FIG. 6A shows the correlation between the power input to the sputtering apparatus and the mass ratio (concentration) of Ar contained in the piezoelectric thin film of the piezoelectric thin film element in Example 2, while FIG. 6B shows the correlation between the power input to the sputtering apparatus and the Ar amount (mass) per unit area of the piezoelectric thin film of the piezoelectric thin film element in Example 2.

Referring to FIGS. 6A and 6B, it is shown that the Ar content in the KNN piezoelectric thin film as the piezoelectric thin film is increased with the increase of the input power (Power). That is, it is shown that the Ar content in the KNN thin film can be controlled to be a desired content by the input power when the KNN thin film is formed by the sputtering method.

Figure 7A:
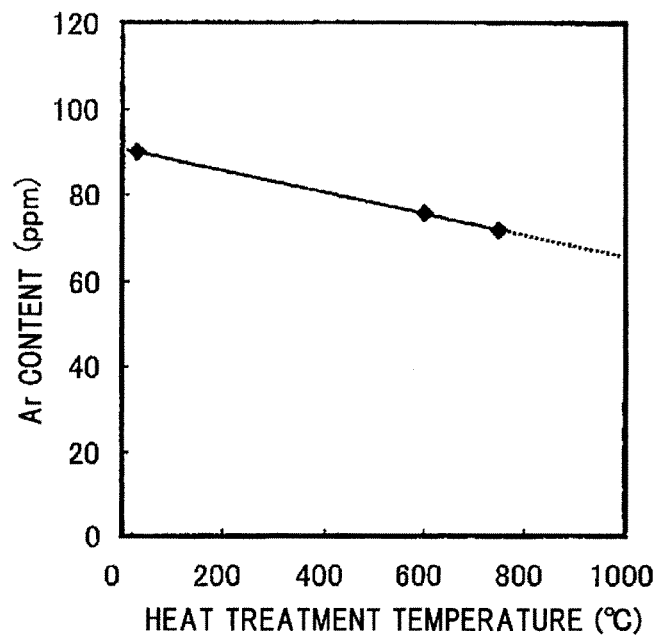
FIG. 7A is a diagram showing the correlation between the heat treatment temperature and the mass ratio (concentration) of Ar contained in the piezoelectric thin film of the piezoelectric thin film element in Example 2.
Figure 7B:
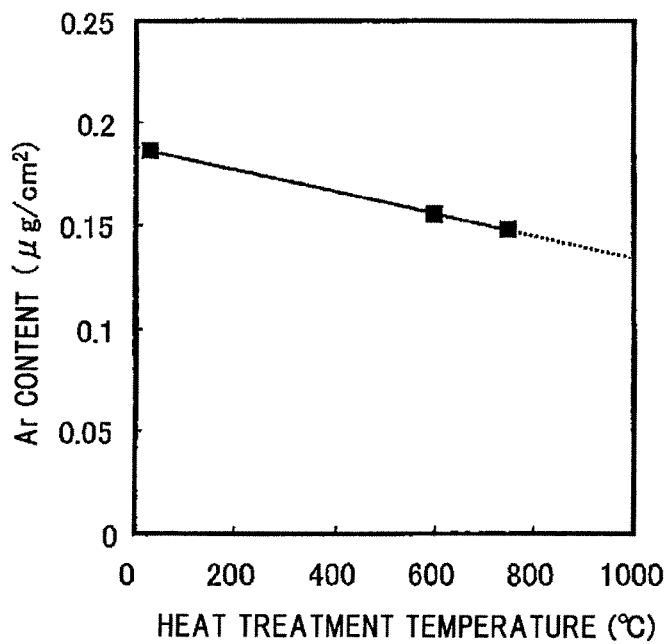
FIG. 7B is a diagram showing the correlation between the heat treatment temperature and the Ar amount (mass) per unit area of the piezoelectric thin film of the piezoelectric thin film element in Example 2.

FIG. 7A shows the correlation between the heat treatment temperature and the mass ratio (concentration) of Ar contained in the piezoelectric thin film of the piezoelectric thin film element in Example 2, while FIG. 7B shows the correlation between the heat treatment temperature and the Ar amount (mass) per unit area of the piezoelectric thin film of the piezoelectric thin film element in Example 2.

Referring to FIGS. 7A and 7B, it is shown that the Ar content in the KNN thin film is decreased with the increase of the heat treatment temperature. That is, it is shown that the Ar content in the KNN thin film can be controlled to be a proper value, by setting the proper heat treatment temperature.

Example 3

A piezoelectric thin film element in Example 3 is fabricated that has a KNN thin film whose Ar content is controlled with the control method for the Ar content in the KNN thin film described in the embodiment and Example 2. Piezoelectric constants and internal stresses of the resultant piezoelectric thin film elements are then evaluated. In Example 3, the sputtering film formation conditions are varied. Except these points, the piezoelectric thin film elements in Example 3 are fabricated in the same manner as the piezoelectric thin film element in Example 1.

Table 1 below shows the sputtering film formation conditions in Example 3, and the results of evaluating the piezoelectric constants and internal stresses of the resultant piezoelectric thin film elements.

TABLE 1

| Power (W) | Ar partial pressure (Pa) | Heat treatment temperature (° C.) | Ar content (ppm) | Ar (μg/cm$^2$) | Piezoelectric constant (arb. units) | Internal stress (GPa) |
|---|---|---|---|---|---|---|
| 60 | 1.33 | No heat treatment | 55.1 | 0.118 | 85.5 | 0.159 |
|  |  |  |  |  | 85.2 | 0.159 |
|  |  |  |  |  | 64.5 | 0.159 |
|  |  |  |  |  | 63.1 | 0.159 |
| 75 | 1.33 | No heat treatment | 60.7 | 0.122 | 66.2 | −0.078 |
|  |  |  |  |  | 67.0 | −0.051 |
|  |  |  |  |  | 69.0 | −0.157 |
|  |  |  |  |  | 71.0 | 0.093 |
|  |  |  |  |  | 67.7 | −0.152 |
|  |  |  |  |  | 68.2 | 0.034 |
|  |  |  |  |  | 61.2 | 0.102 |
|  |  |  |  |  | 55.6 | 0.047 |
|  |  |  |  |  | 56.8 | −0.114 |
|  |  |  |  |  | 66.1 | — |
| 100 | 1.33 | No heat treatment | 68.9 | 0.13 | 60.5 | −0.351 |
|  |  |  |  |  | 51.5 | −0.165 |
|  |  |  |  |  | 43.7 | −0.274 |
|  |  |  |  |  | 42.4 | −0.264 |
|  |  |  |  |  | 44.1 | −0.185 |
|  |  |  |  |  | 39.0 | −0.218 |
|  |  |  |  |  | 86.8 | — |
|  |  |  |  |  | 88.3 | — |

Referring to Table 1, when the Ar content is approximately 32 ppm, the piezoelectric constant of the KNN thin films is from approximately 21 to 34 (arbitrary units). It is shown, on the other hand, that when the Ar content is from approximately 55 to 69 ppm, the piezoelectric constant of the KNN thin films increases to from approximately 56 to 86 (arbitrary units), compared to when the Ar content is approximately 32 ppm. In Table 1, the TS distance is set at 56 mm.

Also, the KNN thin films are formed (i.e. substrates with the KNN thin films are prepared) by controlling the input power, Ar partial pressure. TS distance, so that the target value of the Ar content is 90 ppm. There are prepared samples of the resultant KNN thin films heated at 600° C. and 750° C., and not heated. For each sample, the Ar content is measured. The Ar content in the sample not heated is 89.7 ppm (0.148 μg/cm$^2$), the Ar content in the sample heated at 600° C. is 75.5 ppm (0.156 μg/cm$^2$), and the Ar content in the sample heated at 750° C. is 71.8 ppm (0.148 μg/cm$^2$). That is, it is verified that when the Ar content ranges from approximately 71 to approximately 90 ppm, the Ar content in the KNN thin films is decreased with the increase of the heat treatment temperature. It is verified, on the other hand, that when the Ar content ranges from approximately 71 to approximately 90 ppm, the piezoelectric constant is increased with the increase of the heat treatment temperature, in other words, with the decrease of the Ar content. For comparison, a KNN thin film is fabricated whose Ar content is decreased, by adjusting the ratio of Ar and O$_2$ gas flow (i.e. fixing the pressure at 1.33 Pa, while increasing the O$_2$ gas flow ratio) during sputtering. In this KNN thin film, when the Ar content is 31.8 ppm (i.e. 0.061 μg/cm$^2$, the power is 65 W, the Ar partial pressure is 1.33 Pa, and no heat treatment), the piezoelectric constant is from 20.9 to 33.5 (arb. units), and the internal stress is from −0.070 to −0.076.

Figure 8:
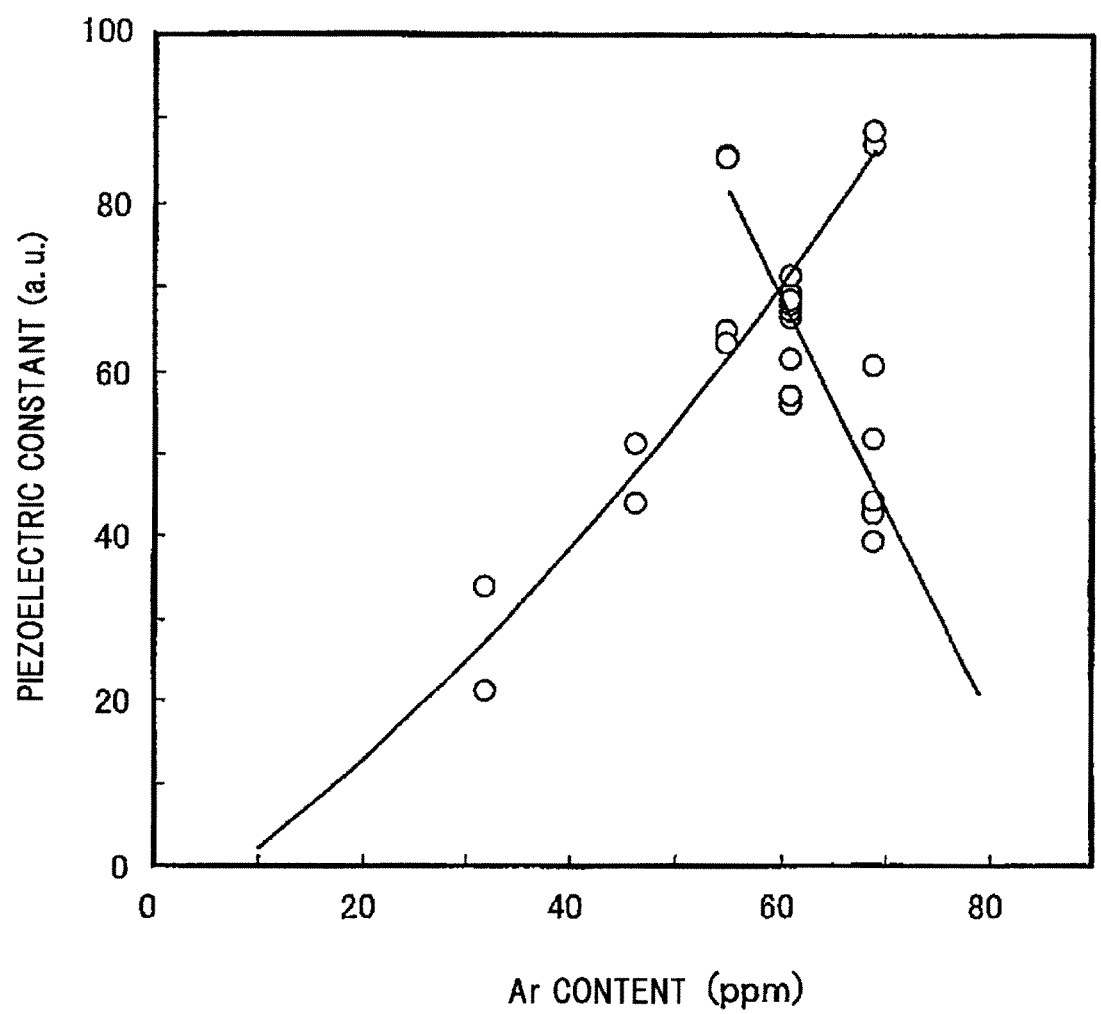
FIG. 8 is a diagram showing the correlation between the Ar content (mass ratio) and the piezoelectric constant of a piezoelectric thin film of a piezoelectric thin film element in Example 3.

FIG. 8 shows the correlation between the Ar content (mass ratio) and the piezoelectric constant of a piezoelectric thin film of a piezoelectric thin film element in Example 3.

In FIG. 8, the horizontal axis is the Ar content (ppm), and the vertical axis is the piezoelectric constant (arb. units). In FIG. 8, the piezoelectric constant for 6.7 MV/m electric field application to the piezoelectric thin film is shown as one example. In Example 3, the unit of the piezoelectric constant is an arbitrary unit, but as a practical specific example of the piezoelectric constant, may use d$_{33}$, which is the variation amount in elongation perpendicular to the lower electrode surface (i.e. elongation in the thickness direction), or d$_{31}$, which is the variation amount in elongation horizontal to the electrode surface.

Referring to FIG. 8, it is shown that there is the direct proportion relationship between the piezoelectric constant and the Ar content, until the Ar content is the specified value. That is, as shown in FIG. 8, it is shown that the piezoelectric constant is increased with the increase of the Ar content. However, it is shown that when the Ar content exceeds the specified value, i.e. approximately 60 ppm, there is the inverse proportion relationship, i.e. the piezoelectric constant is decreased with the increase of the Ar content.

Figure 9:
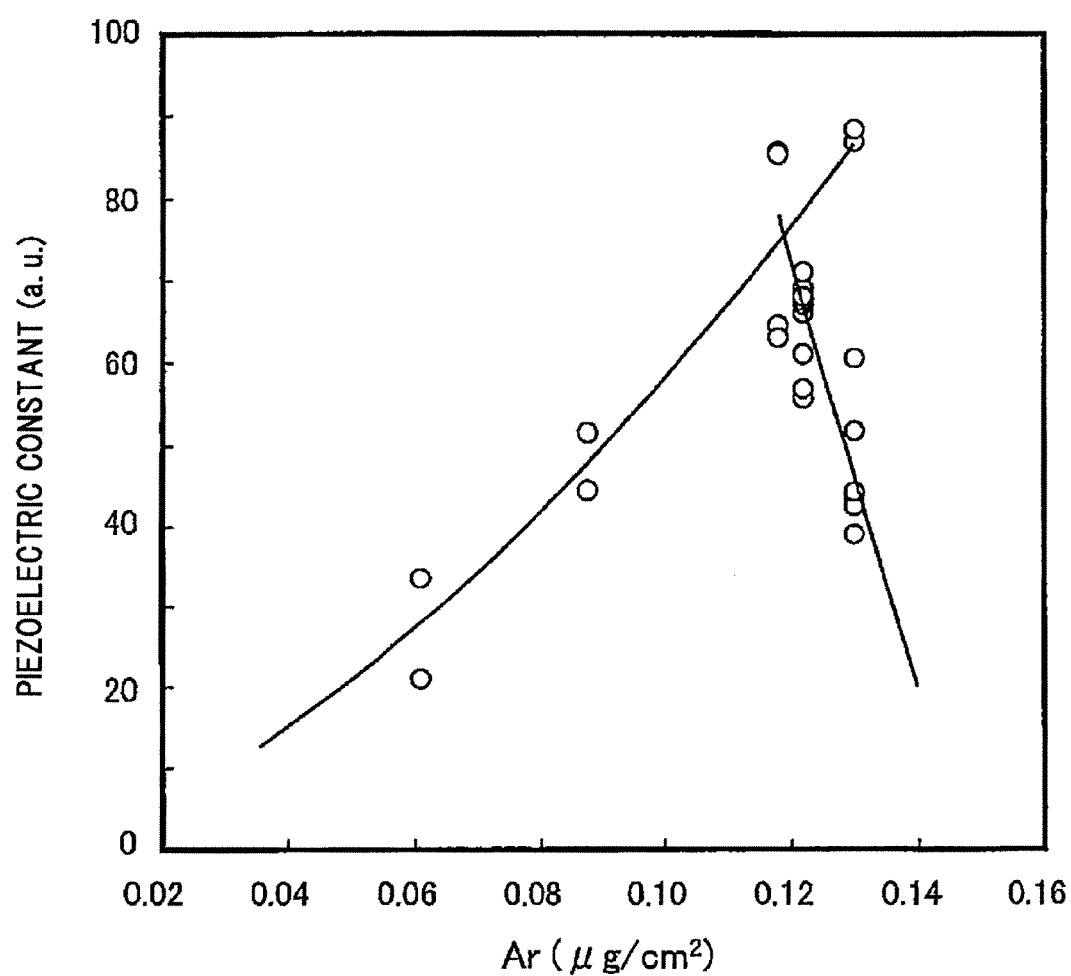
FIG. 9 is a diagram showing the correlation between the Ar content (Ar mass per unit area) and the piezoelectric constant of the piezoelectric thin film of the piezoelectric thin film element in Example 3.

FIG. 9 shows the correlation between the Ar content (Ar mass per unit area) and the piezoelectric constant of the piezoelectric thin film of the piezoelectric thin film element in Example 3.

Referring to FIG. 9, as with FIG. 8, it is shown that the piezoelectric constant is increased with the increase of the Ar content in the KNN thin film until the Ar content is the specified value. However, it is shown that when the Ar content exceeds 0.12 μg/cm$^2$, the piezoelectric constant tends to be decreased. One of the reasons for the piezoelectric constant tending to be decreased is because of an increase in the internal stress of the KNN thin film.

Figure 10:
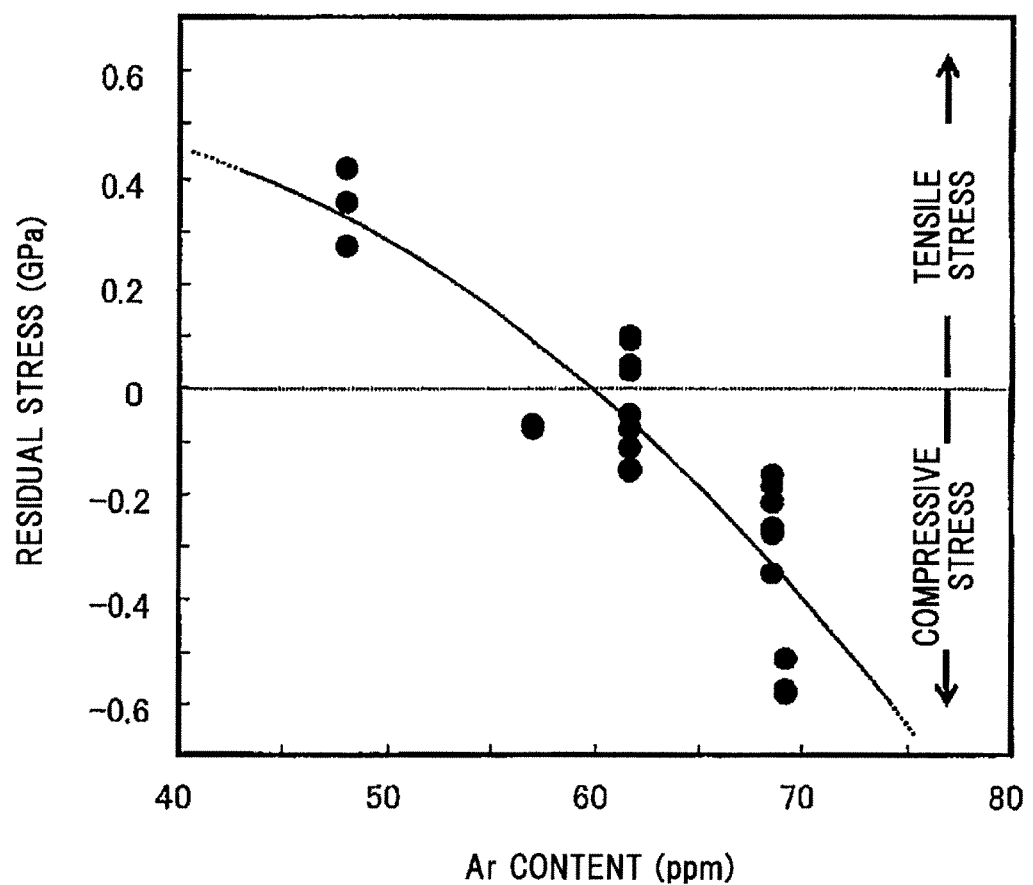
FIG. 10 is a diagram showing the correlation between the Ar content and the internal stress of the piezoelectric thin film of the piezoelectric thin film element in Example 3.

FIG. 10 shows the correlation between the Ar content and the internal stress of the piezoelectric thin film of the piezoelectric thin film element in Example 3.

It is shown that although increasing the input power of the sputtering apparatus allows an increase in the Ar content in the KNN thin film, the compressive stress occurs in the KNN thin film with the increase of the Ar content in the KNN thin film, as shown in FIG. 10. Specifically, it is shown that when the Ar content in the KNN thin film exceeds 60 ppm, the magnitude of the compressive stress caused in the KNN thin film is increased. In the piezoelectric thin film element with the KNN thin film, the piezoelectric property of the piezoelectric thin film element deteriorates with the increase of the magnitude of the compressive stress caused in the KNN thin film.

Also, when the Ar content exceeds 70 ppm, there is an increase in the number of piezoelectric thin film elements subject to the effect of deterioration of the piezoelectric property due to the compressive stress value being increased with an increase in the Ar content, rather than the effect of improvement and stabilization (i.e. reduction in variation) of the piezoelectric property with an increase in the Ar content. There is therefore observed a decrease in the yield. Also, when the Ar content exceeds 80 ppm, the piezoelectric property deteriorates significantly, and there is a significant decrease in the yield of piezoelectric thin film elements for use in device. Further, when the Ar content is smaller than 50 ppm, the piezoelectric property deteriorates, and when the Ar content is smaller than 30 ppm, there is a significant decrease in the yield of piezoelectric thin film elements for use in device.

That is, as shown in FIGS. 8 and 9, one of the reasons for the piezoelectric constant of the piezoelectric thin film being decreased with an increase in the Ar content is because of an increase in the effect of deterioration of the piezoelectric property due to the compressive stress value being increased with an increase in the Ar content, rather than the effect of improvement of the piezoelectric property with an increase in the Ar content. It is therefore shown that, to inhibit the deterioration of the piezoelectric property of the piezoelectric thin film element, the Ar content in the KNN thin film is required to be limited within the specified range.

When using not the sputtering method but the piezoelectric thin film formation method without using the inert gas, the piezoelectric thin film with the specified Ar content can be formed, for example, by ion implantation to add Ar to the piezoelectric thin film. The ion implantation method is to ionize specified atoms or molecules, to implant and add the ionized atoms or molecules accelerated at a few kV to a few MV to the piezoelectric thin film surface. Specifically, Ar ions are produced by an ion source of ion implantation apparatus, and the ions produced by the ion source are accelerated by an electric field generated in an acceleration chamber of the ion implantation apparatus. The accelerated ions are passed through a member to control the ion moving direction, such as a deflector, a slit or the like. A necessary mass of the ions is then selected by a mass spectrometer. Here, the selected ions collide with the piezoelectric thin film, to absorb onto the surface of the piezoelectric thin film, or to be taken into the piezoelectric thin film.

Figure 11:
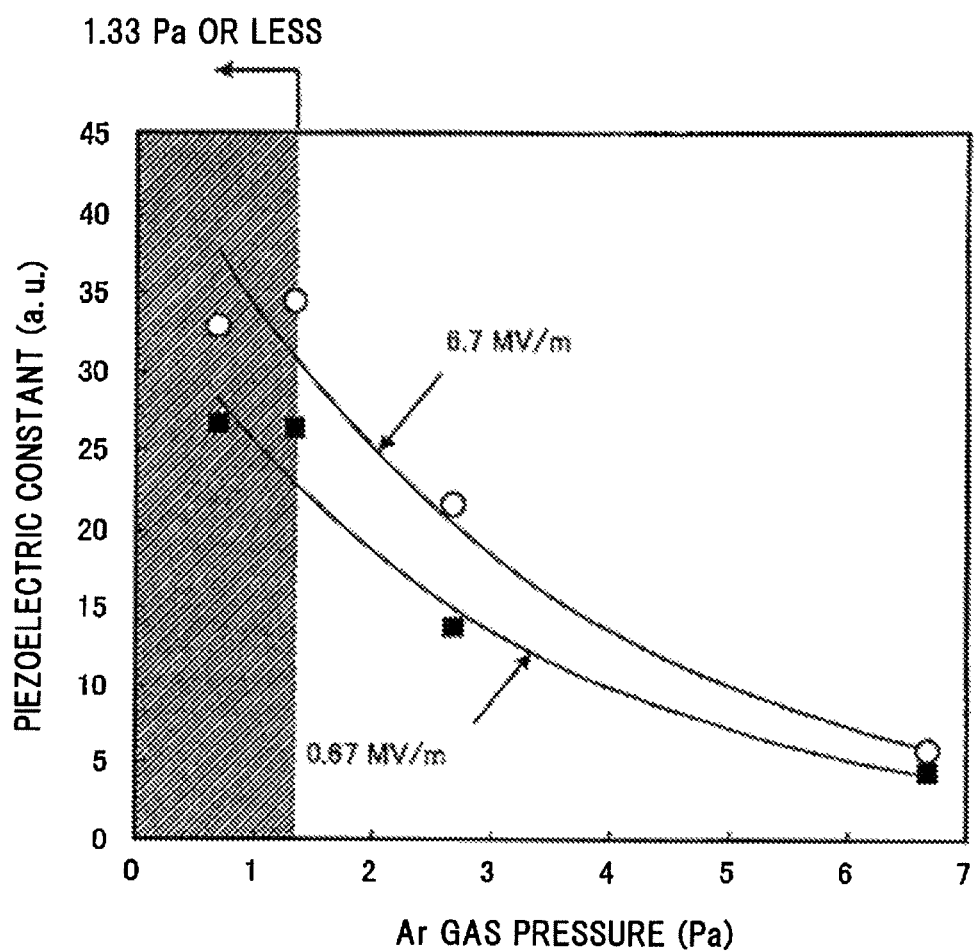
FIG. 11 is a diagram showing the relationship between the Ar gas pressure during sputtering in film formation and the piezoelectric constant of a piezoelectric thin film of a piezoelectric thin film element produced.

FIG. 11 shows the relationship between the Ar gas pressure during sputtering film formation and the piezoelectric constant of a piezoelectric thin film of a piezoelectric thin film element produced.

As seen from FIG. 11, it is shown that, for both 6.7 MV/m and 0.67 MV/m electric field application to the resultant piezoelectric thin film, the piezoelectric constant exceeds 25 (arb. units) when the Ar gas pressure is not more than 1.33 Pa.

As described above, in the piezoelectric thin film having at least the lower electrode, piezoelectric thin film, and the upper electrode disposed on the Si substrate, the piezoelectric thin film has a pseudocubic crystal, a tetragonal crystal, or an orthorhombic crystal, or a coexistence of at least two of the pseudocubic crystal, the tetragonal crystal, and the orthorhombic crystal, and the inert gas element content contained in the piezoelectric thin film is controlled to be within a mass ratio range of not more than 80 ppm, preferably not less than 30 ppm and not more than 70 ppm. It is therefore possible to provide the high performance piezoelectric thin film element.

Although the invention has been described with respect to the above embodiments, the above embodiments are not intended to limit the appended claims. Also, it should be noted that not all the combinations of the features described in the above embodiments are essential to the means for solving the problems of the invention.

INDUSTRIAL APPLICABILITY

According to the present invention, it is possible to provide a piezoelectric thin film element and a piezoelectric thin film device, which allow its enhanced piezoelectric property, enhanced performance, and enhanced productive yield to be ensured.

EXPLANATION OF REFERENCE NUMERALS

1 Piezoelectric thin film element
10 Substrate
12 Oxide film
20 Adhesive layer
30 Lower electrode
40 Piezoelectric thin film
50 Upper electrode
60 Power source
70 Voltmeter
100 Piezoelectric actuator
200 Piezoelectric sensor

What is claimed is:

1. A piezoelectric thin film element, comprising:
   a substrate; and
   a piezoelectric thin film provided on the substrate,
   wherein the piezoelectric thin film has at least one crystal structure represented by the general formula $(Na_xK_yLi_z)NbO_3$ ($0 \leq x \leq 1$, $0 \leq y \leq 1$, $0 \leq z \leq 0.2$, $x+y+z=1$), and selected from the group consisting of a pseudocubic crystal, a tetragonal crystal, and an orthorhombic crystal, and contains a mass ratio of an inert gas element of not more than 80 ppm.

2. The piezoelectric thin film element according to claim 1, wherein
   the piezoelectric thin film contains a not less than 30 ppm and not more than 70 ppm of the inert gas element.

3. The piezoelectric thin film element according to claim 1, wherein
   the piezoelectric thin film contains a not more than 0.16 $\mu g/cm^2$ of the inert gas element.

4. The piezoelectric thin film element according to claim 3, wherein
   the piezoelectric thin film contains a not less than 0.06 $\mu g/cm^2$ and not more than 0.15 $\mu g/cm^2$ of the inert gas element.

5. The piezoelectric thin film element according to claim 1, wherein
   the inert gas element is argon (Ar).

6. The piezoelectric thin film element according to claim 1, further comprising
   a lower electrode between the substrate and the piezoelectric thin film.

7. The piezoelectric thin film element according to claim 6, wherein
   the lower electrode includes an electrode layer formed of Pt or a Pt containing alloy.

8. The piezoelectric thin film element according to claim 6, wherein
   the lower electrode includes a single crystalline oriented layer oriented preferentially in a perpendicular direction to a surface of the substrate.

9. The piezoelectric thin film element according to claim 1, wherein the piezoelectric thin film includes strain parallel to a surface of the substrate.

10. The piezoelectric thin film element according to claim 9, wherein
the strain is strain due to tensile or compressive stress.

11. The piezoelectric thin film element according to claim 1, wherein
the piezoelectric thin film includes inhomogeneous strain in a perpendicular or parallel direction, or perpendicular and parallel directions, to a surface of the substrate.

12. A piezoelectric thin film device, comprising:
the piezoelectric thin film element according to claim 1; and
a voltage applying portion which applies voltage to the piezoelectric thin film element.

13. A piezoelectric thin film device, comprising:
the piezoelectric thin film element according to claim 1; and
a voltage detecting portion which detects voltage applied to the piezoelectric thin film element.

\* \* \* \* \*